United States Patent
Kim et al.

(10) Patent No.: US 9,543,371 B2
(45) Date of Patent: Jan. 10, 2017

(54) TRANSPARENT DISPLAY DEVICE HAVING A MINIMIZED BEZEL

(71) Applicant: LG Display Co., Ltd., Seoul (KR)

(72) Inventors: Hyoung-Su Kim, Anyang-si (KR); BuYeol Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 14/554,896

(22) Filed: Nov. 26, 2014

(65) Prior Publication Data

US 2015/0179727 A1    Jun. 25, 2015

(30) Foreign Application Priority Data

Dec. 20, 2013 (KR) .......................... 10-2013-0160755

(51) Int. Cl.
*H01L 27/32* (2006.01)
*H05K 1/02* (2006.01)
*H01L 51/00* (2006.01)
*G09G 3/32* (2016.01)

(52) U.S. Cl.
CPC ......... *H01L 27/3276* (2013.01); *G09G 3/3225* (2013.01); *G09G 2300/0426* (2013.01); *G09G 2330/028* (2013.01)

(58) Field of Classification Search
CPC .......................... H01L 27/3276; G09G 3/3225
See application file for complete search history.

(56) References Cited

U.S. PATENT DOCUMENTS

| 2014/0239823 A1* | 8/2014 | Ahn | G09G 3/3233 315/161 |
| 2015/0138146 A1* | 5/2015 | Hong | G06F 3/044 345/174 |
| 2015/0187279 A1* | 7/2015 | Lee | G09G 3/3225 257/40 |

FOREIGN PATENT DOCUMENTS

| CN | 1154487 A | 7/1997 |
| CN | 1440016 A | 9/2003 |
| CN | 201637967 U | 11/2010 |
| CN | 102540525 A | 7/2012 |
| CN | 102651206 A | 8/2012 |
| CN | 103163702 A | 6/2013 |
| CN | 103221896 A | 7/2013 |
| EP | 0735405 A3 | 11/1997 |

(Continued)

OTHER PUBLICATIONS

Office Action for Chinese Patent Application No. CN 201410730032.7, Sep. 26, 2016, 11 Pages.

*Primary Examiner* — Joseph L Williams
(74) *Attorney, Agent, or Firm* — Fenwick & West LLP

(57) ABSTRACT

A transparent organic light-emitting display device is described herein. The transparent substrate includes a display area and non-display area adjacent to the display area. An organic light-emitting element is disposed on the display area of the transparent substrate. A first power line is disposed on the display area of the transparent substrate. The first power line supplies power to the organic light-emitting element. A first circuit board comprises a first power supply provided on a first side of the transparent substrate and a second circuit board comprises a second power supply provided on a second side of the transparent substrate. The first power supply is configured to receive power from the second power supply via the first power line. An additional interconnection film to supply power to the first power (Continued)

supply is not required, and thus the width of the bezel can be reduced.

20 Claims, 6 Drawing Sheets

(56) References Cited

FOREIGN PATENT DOCUMENTS

| | | |
|---|---|---|
| JP | H1138433 A | 2/1999 |
| JP | H1165472 A | 3/1999 |
| JP | 2003202543 A | 7/2003 |
| JP | 3731774 B2 | 1/2006 |
| WO | WO 2010/073716 A1 | 7/2010 |

* cited by examiner

TRANSPARENT DISPLAY DEVICE HAVING A MINIMIZED BEZEL

CROSS-REFERENCE TO RELATED APPLICATIONS

This application claims the priority of Korean Patent Application No. 10-2013-0160755 filed on Dec. 20, 2013 in the Korean Intellectual Property Office, the disclosure of which is incorporated herein by reference.

BACKGROUND

Field of Technology

The present disclosure relates to a transparent display device and a transparent organic light-emitting display device with reduced width and thickness of their bezels.

Description of the Related Art

An organic light-emitting display (OLED) device is capable of emitting light and thus does not require an additional light source, unlike a liquid crystal display (LCD). Therefore, an OLED device can be made lighter and thinner than a LCD device. Further, an OLED device has advantages in that it consumes less power, realizes better colors and has good response speed, view angle and contrast ratio (CR) than a LCD device. For at least these reasons, an OLED device is considered as the next generation display.

SUMMARY

A "transparent display device" means that a viewer can see a background through the display along with images displayed thereon. The pixel area of a transparent OLED device can be divided into a light-emitting area in which organic light-emitting elements emit lights to display images, and a transparent area through which external light passes. Transparency of the transparent OLED device is obtained by the transparent area Typically, the substrate of a display device comprises a display area and non-display area. Opaque elements such as a battery and a plurality of circuit boards are disposed under the display area of the substrate. Therefore, even when the display area is transparent, it is difficult to make the display device transparent. In order to achieve a transparent display device under the given condition, it can be conceived to place opaque elements on one side of the display device all together, or to divide them into two parts to place one on either side of the display device.

When two circuit boards are separately placed on two sides of the transparent display device, the elements on one circuit board are electrically connected to the elements on the other circuit board via an additional interconnection film, which is a separate element from a substrate. When the additional interconnection film is disposed on the side portions of the substrate, the bezel size of the transparent display device is increased. Also, the thickness of the interconnection film can increase the thickness of the transparent display device. In addition, when a printing process is used to manufacture the interconnection film, it is difficult to form the lines of the interconnection film in a multi-layered structure. Because the lines are spread apart, the width of the interconnection film is increased proportional to the width and/or number of the lines. This can increase the width of the bezel of the transparent display device even further. In view of this, a novel transparent display device and a transparent OLED device with reduced width and thickness of their bezels is described herein.

An object of the present disclosure is to provide a transparent OLED device with reduced width of its bezel by utilizing existing lines formed on a substrate of the transparent OLED device, without an additional interconnection film for electrically connecting elements disposed on separate circuit boards.

Another object of the present disclosure is to provide a transparent display device and a transparent OLED device with reduced width of their bezels by connecting elements disposed on one side of the transparent display device to elements on another side via lines directly formed on a substrate of the transparent display device, instead of a separate interconnection film.

Yet another object of the present disclosure is to provide a transparent display device and a transparent OLED device in which lines for connecting elements on two separate circuit boards are provided on the transparent substrate to reduce the size of the bezel without undesired noise between the lines.

The objects of the disclosure are not limited to the aforementioned objects, and other objects, which are not mentioned above, will be apparent to those skilled in the art from the following description.

According to an aspect of the present disclosure, there is provided a novel transparent organic light-emitting display device. The transparent substrate includes a display area and non-display area adjacent to the display area. An organic light-emitting element is disposed on the display area of the transparent substrate. A first power line is disposed on the display area of the transparent substrate. The first power line supplies power to the organic light-emitting element. A first circuit board comprises a first power supply provided on a first side of the transparent substrate and a second circuit board comprises a second power supply provided on a second side of the transparent substrate. The first power supply is configured to receive power from the second power supply via the first power line.

No additional interconnection film to supply power to the first power supply is required, and thus the width of the bezel can be reduced.

According to another aspect of the present disclosure, there is provided a novel transparent display device. The transparent display device includes a transparent substrate having a display area and a non-display area disposed on the periphery of the display area. A first substrate and a second substrate are respectively connected to a different side of the transparent substrate. A plurality of connecting lines is disposed on the non-display area of the transparent substrate. The plurality of connecting lines electrically connects a first element on the first substrate and a second element on the second substrate. By forming the plurality of connecting lines on the non-display area of the transparent substrate, the width of its bezel can be reduced, compared to when an additional interconnection film is employed.

The detailed aspects of other embodiments are included in the detailed specification and drawings.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Figure 1A:
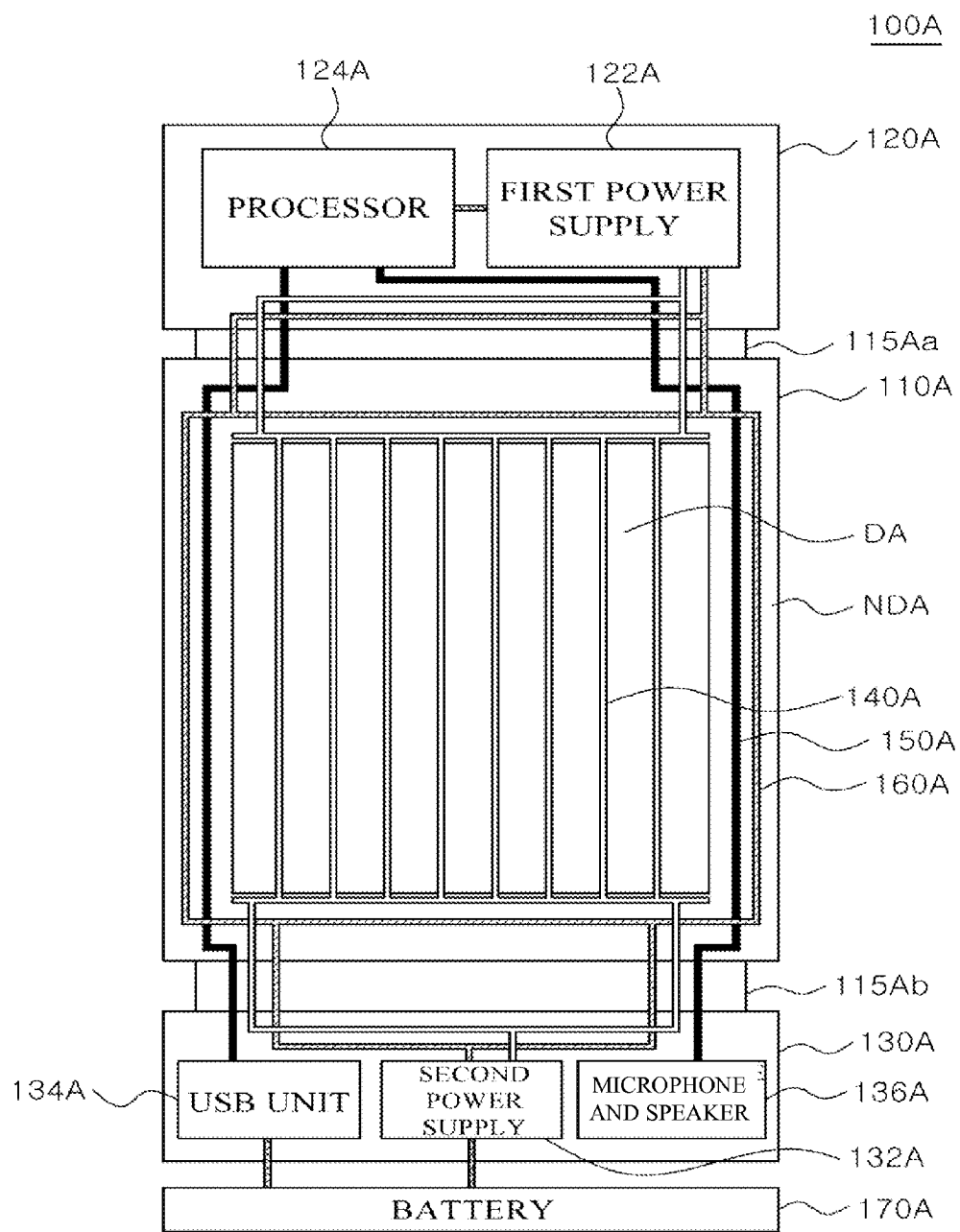
FIG. 1A is a simplified plan view of a transparent OLED device according to an exemplary embodiment of the present disclosure.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below maybe a second component within the technical spirit of the present invention.

The same reference numerals indicate the same elements throughout the specification.

In the drawings, size and thickness of each element are arbitrarily illustrated for convenience of description, and the present invention is not necessarily limited to those illustrated in the drawings.

In the present specification, "transparent" or "transparency" means a transparent property and enabling a visible ray to pass through. In addition, it means that the entire incident light is not absorbed, and at least a part of the light is penetrated. Therefore, in a case where the element is transparent or has transparency, a viewer can recognize color, contrast, or the like of the things behind the element.

In a transparent display device, a bezel refers to the frame portion of the transparent display device where images are not displayed when a viewer watches images from the transparent display device. The non-display area NDA of the transparent substrate 110A corresponds to a portion of the bezel of the transparent OLED device 100A.

The components of various embodiments of the present disclosure can be partially or entirely bonded to or combined with each other and can be interlocked and operated in technically various ways as can be fully understood by an ordinary person skilled in the art, and the embodiments can be carried out independently of or in association with each other.

Hereinafter, various embodiments of the present disclosure will be described in detail with reference to the accompanying drawings.

FIG. 1A is a simplified plan view of a transparent OLED device according to an exemplary embodiment of the present disclosure. Referring to FIG. 1A, a transparent OLED device 100A includes a transparent substrate 110A, connecting substrates 115Aa and 115Ab, a first circuit board 120A, a second circuit board 130A, and a battery 170A. Further, on the transparent substrate 110A, a first power line 140A, a plurality of connecting lines 150A, and a second power line 160A are formed.

The transparent substrate 110A supports a variety of elements in the transparent OLED device 100A and is made of a transparent material. The transparent substrate 110A includes a display area DA and a non-display area NDA adjacent to the display area DA. The display area DA is where images are displayed. Although not illustrated in FIG. 1A, organic light-emitting elements and thin-film transistors are formed on the display area DA. The non-display area is where no image is displayed.

The connecting substrate 115Aa is disposed on a side of the transparent substrate 110A to connect the transparent substrate 110A to the first circuit board 120A. The connecting substrate 115Ab is disposed on another side of the transparent substrate 110A to connect the transparent substrate 110A to the second circuit board 130A. The connecting substrate 115Aa and 115Ab may be flexible printed circuit boards made of flexible materials.

The first circuit board 120A is connected to the transparent substrate 110A via the connecting substrate 115Aa disposed on the side of the transparent substrate 110A. On the first circuit board 120A, a processor 124A and a first power supply 122A are disposed.

The second circuit board 130A is connected to the transparent substrate 110A via the connecting substrate 115Ab disposed on the other side of the transparent substrate 110A. On the second circuit board 130A, a universal serial bus (USB) unit 134A, a second power supply 132A, a microphone and speaker 136A are disposed.

The USB unit 134A includes a USB socket and a charge circuit. The USB unit 134A charges the battery 170A via the charge circuit when a charging cable is connected to the USB socket. When an external device, such as a data cable, capable of transmitting and receiving data signals is connected to the USB socket, the USB unit 134A transmits/receives data signals to/from the processor 124A.

The microphone and speaker 136A include a microphone to receive sound and a speaker to output sound and transmits/receives sound signals to/from the processor 124A.

The first circuit board 120A and the second circuit board 130A may be printed circuit boards.

On the transparent substrate 110A, the first power line 140A, the second power line 160A and the plurality of connecting lines 150A are formed. FIG. 1A illustrates the connective relationships among the elements. In FIG. 1A, the first power line 140A, the second power line 160A and the plurality of connecting lines 150A are drawn as if they were formed across the transparent substrate 110A, the first circuit board 120A, the second circuit board 130A, and the connecting substrate 115Aa and 115Ab. However, it should be appreciated that FIG. 1A merely illustrates the electrical connection between them. That is to say, the first power line 140A, the second power line 160A and the plurality of connecting lines 150A merely refer to lines formed on the transparent substrate 110A. Interconnection between the first power line 140A, the second power line 160A and the plurality of connecting lines 150A to the elements disposed on the first circuit board 120A and/or the second circuit board 130A may be provided via other lines or connection interfaces formed on the connecting substrates 115Aa and 115Ab.

The first power line 140A is formed on the display area DA of the transparent substrate 110A to drive an organic light-emitting element in the display area DA. That is, the first power line 140A supplies power to the organic light-emitting elements. In addition to driving the organic light-emitting elements, the first power line 140A also serves as the line for delivering power to the first power supply 122A so that the first power supply 122A can provide power to the processor 124A.

The power on the first power line 140A is supplied from the battery 170A via the second power supply 132A. In other words, the second power supply 132A receives power from the battery 170A and provides the power to the organic light-emitting elements of the display area DA as well as to the first power supply 122A through the first power line 140A. The first power line 140A may be a VDD line of the transparent OLED device 100A.

The first power supply 122A and the second power supply 132A receive power from the external power source (e.g., battery 170A) in the form of voltage at a specific level and transform the received voltage into a voltage of a level as required by the elements connected thereto. Specifically, the second power supply 132A transforms the voltage supplied from the battery 170A into a drive voltage for the organic light-emitting elements arranged on the display area DA, which is supplied to the organic light-emitting elements via the first power line 140A. The first power supply 122A and the second power supply 132A are electrically connected by the first power line 140A, and thus the first power supply 122A receives the same drive voltage supplied to the organic light-emitting elements. The first power supply 122A transforms the received voltage into a voltage required by the processor 124A. For example, the second power supply 132A may receive a first voltage (e.g., 3.8 V) from the battery 170A, and the second power supply 132A may supply a second voltage (e.g., 10 V) to the organic light-emitting elements in the display area DA and to the first power supply 122A via the first power line 140A. The first power supply 122A transforms the second voltage into a third voltage (e.g., 1.8 V), which is provided to an element connected to the first power supply 122A (e.g., the processor 124A).

The second power line 160A is formed on the non-display area NDA. Like the first power line 140A, the second power line 160A is also used to drive the organic light-emitting elements. In particular, the second power line 160A connects the first power supply 122A to the second power supply 132A and is referenced to the ground potential GND. The second power line 160A may be a VSS line of the transparent OLED device 100A.

According to the exemplary embodiment of the present disclosure, the first power line 140A formed on the display area DA of the transparent substrate 110A and the second power line 160A formed on the non-display area NDA of the transparent substrate 110A connect the first power supply 122A and the second power supply 132A to supply power from the second power supply 132A to the first power supply 122A. As mentioned above, the first power line 140A and the second power line 160A also serve as the power lines for driving the organic light-emitting elements arranged on the display area DA. In this configuration, no additional interconnection film is required on a side of the substrate to provide connection between the first power supply 122A and the second power supply 132A. Therefore, the width of the bezel of the transparent OLED device 100A can be reduced. By eliminating the needs for the separate interconnection film, the thickness of the transparent OLED device 100A can be decreased.

The plurality of connecting lines 150A formed on the non-display area NDA of the transparent substrate 110A electrically connects the first circuit board 120A to the second circuit board 130A. That is, the plurality of connecting lines 150A formed on the non-display area NDA of the transparent substrate 110A electrically connects the elements disposed on the first circuit board 120A to the elements disposed on the second circuit board 130A. As illustrated in FIG. 1A, the plurality of connecting lines 150A electrically connects the processor 124A disposed on the first circuit board 120A to the USB unit 134A and to the microphone and speaker 136A disposed on the second circuit board 130A.

The processor 124A disposed on the first circuit board 120A is configured to receive power from the first power supply 122A. In operation, the processor 124A on the first circuit board 120A transmits/receives data signals and/or other detection signals to and from the elements disposed on the second circuit board 130A via the plurality of connecting lines 150A. Using the signals on the plurality of connecting lines 150A, the processor 124A can carry out various functionalities such as recognizing and checking status of external devices connected to the USB unit 134A. When an external device capable of transmitting and receiving data signals is connected to the USB socket, the USB unit 134A may transmit/receive data signals to and from the processor 124A via the plurality of connecting lines 150A. Likewise, the processor 124A may communicate with the microphone and speaker 136A via the plurality of connecting lines 150A.

It should be noted that the plurality of connecting lines 150A are not associated with driving the thin-film transistors or the organic light-emitting elements on the display area DA. Instead, the plurality of connecting lines 150A are formed on the non-display area NDA of the transparent substrate 110A for the communication between the elements on two separate circuit boards 120A and 130A without the additional interconnection film.

According to the exemplary embodiment of the present disclosure, however, additional interconnection film to connect between elements formed on two sides of the transparent OLED device 100A is not required. Although the width of the bezel of the transparent OLED device 100A is increased by the width of the plurality of connecting lines 150A formed on the non-display area NDA of the transparent substrate 110A, the increase in the bezel size by the plurality of connecting lines 150A is smaller than the increase in the bezel size by using an additional interconnection film. For example, the overall width of the plurality of connecting lines 150A may be approximately 1,500 μm or less, and the width of an additional interconnection film may be approximately 2.5 mm. As illustrated by this example, the width of the bezel of the transparent OLED device 100A can be reduced by using the connecting lines 150A. Moreover, decrease in the thickness of the transparent OLED device 100A may also be achieved by eliminating the additional interconnection film.

Referring to FIG. 1A, the plurality of connecting lines 150A are disposed between the second power line 160A formed on the non-display area NDA, and the display area DA. As mentioned, the second power line 160A is referenced to the ground potential. Thus, by placing the plurality of connecting lines 150A on an inner side (i.e., closer to the display area DA) than the second power line 160A, the second power line 160A can shield the plurality of connecting lines 150A from possible electrical noises. Such noises may cause interference between the signals or may distort the signals on the plurality of connecting lines 150A. Accordingly, distorted signals may be transmitted to the processor 124A thereby generating errors. According to an exemplary embodiment of the present disclosure, the plurality of connecting lines 150A are located between the second power line 160A and the display area DA. By doing so, the transparent OLED device 100A can reduce influence of noise from outside the device 100A on signals flowing in the plurality of connecting lines 150A. If noise from the external environment is negligible, however, the plurality of connecting line 150A may be located on the outer side than the second power line 160A.

The battery 170A supplies power to a variety of elements via the second power supply 132A. When a charging cable is connected to the USB socket of the USB unit 134A, a charge circuit, which may be a part of the USB unit 134A, can charge the battery 170A.

Although the first circuit board 120A and the second circuit board 130A illustrated in FIG. 1A are positioned on opposing sides of the transparent substrate 110A, it is merely illustrative. In an alternative embodiment of the transparent OLED device 100A, the first circuit board 120A and the second circuit board 130A may be located on one side and any other side of the transparent OLED device 100A than shown in FIG. 1A.

It should be noted that the elements disposed on the first and the second circuit boards are not particularly limited as depicted in FIG. 1A. Although the microphone and the speaker are illustrated as being disposed together in the microphone and speaker 136A on the second circuit board 130A in FIG. 1A, in some other embodiments, they can be disposed separately, one on the first circuit board 120A and the other on the second circuit board 130A.

In addition to the microphone and the speaker 136A illustrated in FIG. 1A, various types of sensors and camera modules can be disposed in the transparent OLED device 100A. Various types of sensors may include, for example, an illuminance sensor, an acceleration sensor, a proximity sensor, a gyroscope sensor, a magnetic sensor, and a temperature sensor. Similar to the microphone and speaker 136A, any of the aforementioned additional components disposed on the second circuit board 130A may communicate with the processor 124A on the first circuit board 120A via the plurality of connecting lines 150A. The number and thickness of the plurality of connecting lines 150A may be modified depending on the number and the type of the various types of sensors and camera modules connected thereto, and on the voltage level of signals flowing therein.

The transparent OLED device 100A may further include a memory (for example, a RAM), a communication module or the like. The size of the first circuit board 120A may be larger than the size of the second circuit board 130A to provide sufficient room for the elements disposed on the first circuit board 120A. In some embodiments, such components may be disposed on the same circuit board on which the processor 124A and the first power supply 122A are disposed. Some of the components may need to be positioned closer to processor 124A than others to reduce undesirable noises. As such, such components, for instance the memory, may be disposed as close to the processor 124A. The first power supply 122A may supply power of approximately 2.5 V to the memory.

In FIG. 1A, for the convenience of illustration, the transparent OLED device 100A receives power from the battery 170A. However, in case of a large, transparent OLED device such as a large-scale television, the transparent OLED device 100A may be directly connected to an external power source without the battery 170A or the USB unit 134A.

In FIG. 1A, the first power line 140A is formed on the display area DA of the transparent substrate 110A while the second power line 160A is formed on the non-display area NDA. However, it should be appreciated that a part of the first power line 140A may be formed on the non-display area NDA, and a part of the second power line 160A may be formed on the display area DA.

In some embodiments of the transparent OLED device 100A, the second power line 160A is not referenced to the GND but may be supplied with a voltage lower than a voltage loaded on the first power line 140A for operating the organic light-emitting elements arranged on the display area DA. In this case, an additional ground potential line may be provided on the transparent substrate 110A and connected to the first power supply 122A and the second power supply 132A.

Figure 1B:
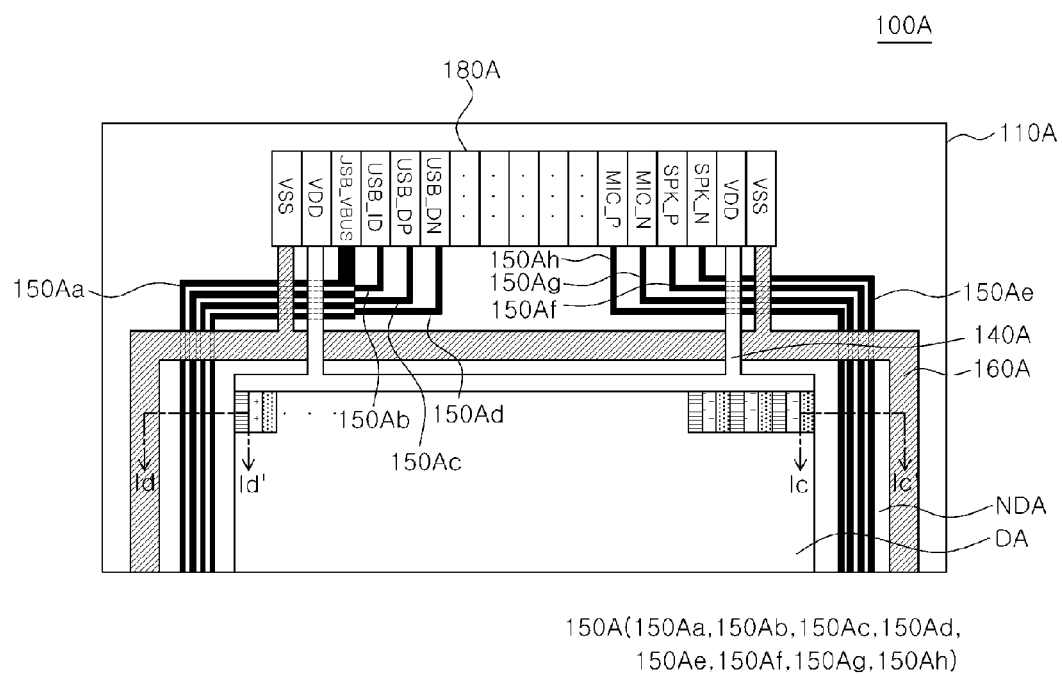
FIG. 1B is an enlarged view of a portion of the display area and the non-display area of a transparent substrate in the transparent OLED device according to an exemplary embodiment of the present disclosure.
Figure 1C:
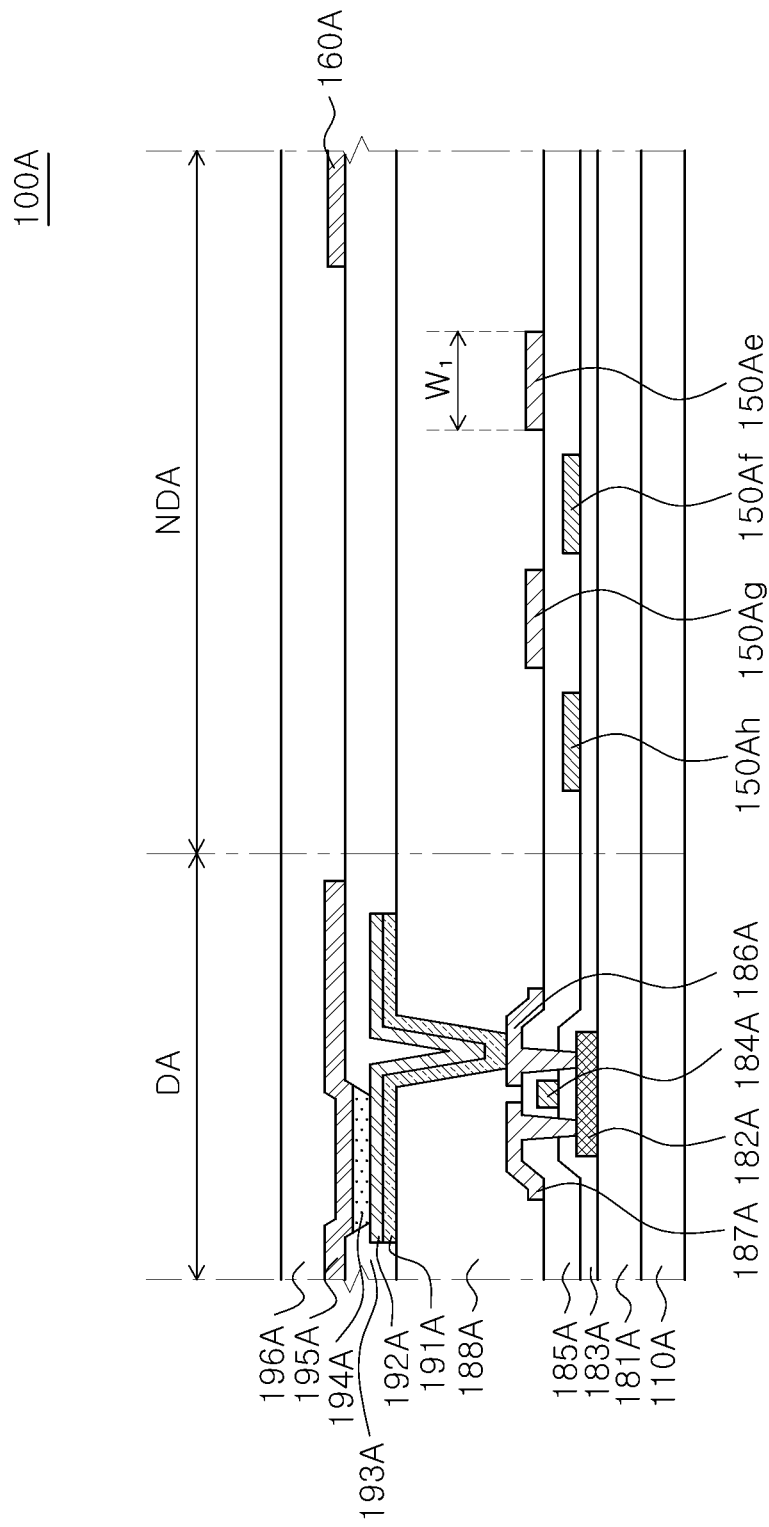
FIG. 1C is a cross-sectional view of the transparent OLED device, taken along line Ic-Ic' of FIG. 1B.
Figure 1D:
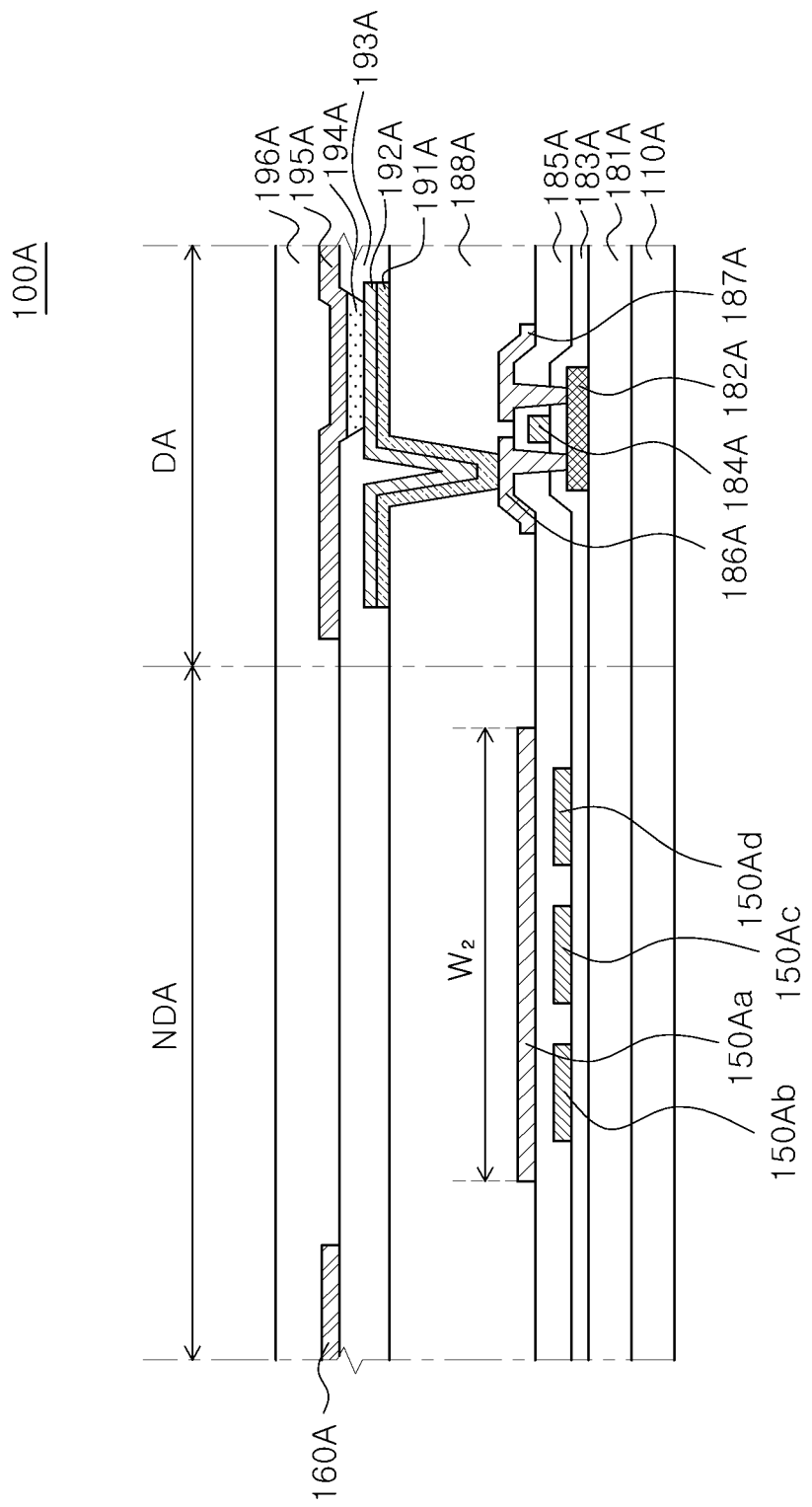
FIG. 1D is a cross-sectional view of the transparent OLED device, taken along line Id-Id' of FIG. 1B.

FIG. 1B is an enlarged view of a portion of a display area DA and a non-display area NDA of transparent substrate 110A in a transparent OLED device 100A according to an exemplary embodiment of the present disclosure. FIG. 1C is a cross-sectional view of the transparent OLED device, taken along line Ic-Ic' of FIG. 1B. FIG. 1D is a cross-sectional view of the transparent OLED device, taken along line Id-Id' of FIG. 1B. Referring to FIG. 1B, a transparent substrate 110A includes a display area DA and non-display area NDA. On the non-display area NDA, a first power line 140A, a plurality of connecting lines 150A (e.g., 150Aa, 150Ab, 150Ac, 150Ad, 150Ae, 150Af, 150Ag, 150Ah), a second power line 160A and a pad unit 180A are formed.

The first power line 140A, the plurality of connecting lines 150A and the second power line 160A are connected to the pad unit 180A formed on the non-display area NDA of the transparent substrate 110A. The pad unit 180A serves to electrically connect the lines on the transparent substrate 110A to the lines on the connecting substrate 115Aa or 115Ab illustrated in FIG. 1A and/or the circuit board 120A or 130A. The pad unit 180A is made of a conductive material. In FIG. 1B, the symbols of lines connected to the pad unit 180A are illustrated on the pad unit 180A.

Referring to FIGS. 1B, 1C and 1D, the plurality of connecting lines 150A includes a plurality of signal lines 150Ab, 150Ac, 150Ad, 150Ae, 150Af, 150Ag and 150Ah, and a detection signal line 150Aa. The plurality of signal lines 150Ab, 150Ac, 150Ad, 150Ae, 150Af, 150Ag and 150Ah serve to connect various elements to a processor.

A USB_ID line 150Ab recognizes whether a USB device is connected to the USB unit 134A. Also, the USB_ID line 150Ab may be referenced to a floating potential or to the ground potential depending on whether a USB device is connected. A USB DP line 150Ac and a USB DN 150Ad in pair transmit/receive data to/from the processor. A SPK_N line 150Ae and a SPK_P 150Af in pair transmit/receive a speaker output signal to/from the processor 124A. A MIC_N line 150Ag and a MIC_P 150Ah in pair transmit/receive a microphone input signal to/from the processor 124A.

The detection signal line 150Aa, which is a USB_VBUS line, is connected to the processor 124A and may be supplied with a voltage or a current higher than voltages or currents supplied to the plurality of signal lines 150Ab, 150Ac, 150Ad, 150Ae, 150Af, 150Ag, 150Ah. For example, the detection signal line 150Aa may be supplied with, but is not limited to, a voltage of approximately 5 V, or a current of approximately 500 mA. Further, the detection signal line 150Aa may allow the processor 124A to recognize whether charging is being carried out.

Referring to FIG. 1C, a thin-film transistor and an organic light-emitting element on the display area DA of the transparent substrate 110A are illustrated.

A buffer layer 181A is formed on the transparent substrate 110A. On the buffer layer 181A, a coplanar thin-film transistor is formed that includes an active layer 182A, a gate electrode 184A, a source electrode 186A and a drain electrode 187A. The source electrode 186A and the drain electrode 187A are connected to the active layer 182A via contact holes formed in a gate insulation layer 183A and in an inter-layer insulation layer 185A. Although a coplanar thin-film transistor is illustrated in FIG. 1C, the type of the thin-film transistor is not limited thereto but the thin-film transistor may be formed in other structures. Further, although the gate insulation layer 183A is formed over the surface of the transparent substrate 110A in FIG. 1C, the gate insulation layer 183A may be formed only on the active layer 182A.

On the thin-film transistor, an over coat layer 188A to flatten the portion over the thin-film transistor is formed. On the over coat layer 188A, an anode 192A, an organic light-emitting layer 194A and a cathode 195A are formed to implement an organic light-emitting element. A reflective layer 191A may be formed under the anode 192A, which may be in contact with the source electrode 186A via a contact hole in the over coat layer 188A. A bank 193A is formed on the edge portion of the anode 192A that separates adjacent pixels. An encapsulation layer 196A for protecting the organic light-emitting element is formed over the cathode 195A. 100A of a top emission type is illustrated in which light from the organic light-emitting layer 194A passes through the cathode 195A. However, an OLED device 100A of a bottom emission type maybe used in which light from the organic light-emitting layer 194A passes through the anode 192A. Even in the bottom emission type, the reflective layer 191A may also be used if desired. In addition, although the anode 192A is connected to the source electrode 186A in FIG. 1C, the anode 192A may be connected to the drain electrode 187A depending on the type of the thin-film transistor.

The plurality of signal lines 150Ab, 150Ac, 150Ad, 150Ae, 150Af, 150Ag and 150Ah maybe formed on a same layer and spaced apart from one another. Alternatively, some of the plurality of signal lines 150Ab, 150Ac, 150Ad, 150Ae, 150Af, 150Ag and 150Ah may be formed on two or more of different layers without being overlapped by one another. For instance, the SPK_N line 150Ae and the MIC_N line 150Ag can be formed on the inter-layer insulation layer 185A, and the SPK_P line 150Af and the MIC_P line 150Ah may be formed on the gate insulation layer 183A as shown in FIG. 1C. The lines on each of the insulation layers are spaced apart from other lines on the respective insulation layer. Also, the SPK_N line 150Ae and the MIC_N line 150Ag on the inter-layer insulation layer 185A do not overlap with the SPK_P line 150Af and the MIC_P line 150Ah on the gate insulation layer 183A.

The plurality of signal lines 150Ab, 150Ac, 150Ad, 150Ae, 150Af, 150Ag and 150Ah serve to connect various elements to a processor in order to transmit/receive signals. The width of each of the signal lines may be equal to or less than 100 μm. Although the signal lines 150Ae, 150Ag, 150Af and 150Ah have the same width W1 in FIG. 1, it is merely illustrative. The width of each of the signal lines may be differently designed based on the voltage level of signals and/or the type of signals to be transmitted on the signal line.

Signals flowing in the plurality of signal lines 150Ab, 150Ac, 150Ad, 150Ae, 150Af, 150Ag and 150Ah have low voltage levels and thus are sensitive to noise. Accordingly, interference among the signals may occur. Therefore, the signal lines 150Ab, 150Ac, 150Ad, 150Ae, 150Af, 150Ag and 150Ah should be spaced apart from one another by a predetermined distance. For example, the distance between signal lines may be approximately 4 μm or more. However, the distance is not limited thereto but may be modified in view of the voltage levels of signals flowing in the signal lines, for example.

On the outer side of the connecting lines 150A, the second power line 160A is formed so as to shield the connecting lines 150A from the noise generated the outside of the transparent OLED device 100A.

The signal lines 150Ab, 150Ac, 150Ad, 150Ae, 150Af, 150Ag and 150Ah are formed on the non-display area NDA of the transparent substrate 110A so as to connect various elements to the processor. Therefore, an additional interconnection film to connect the elements formed on both sides of the transparent OLED device 100A is not required, thereby reducing the width of bezel of the transparent OLED device 100A.

The plurality of connecting lines 150A may include the detection signal line 150Aa in addition to the plurality of signal lines 150Ab, 150Ac, 150Ad, 150Ae, 150Af, 150Ag and 150Ah. The detection signal line 150Aa and some of signal lines 150Ab, 150Ac, 150Ad, 150Ae, 150Af, 150Ag and 150Ah may be formed on two or more different layers. In this case, a part of the detection signal line 150Aa may be arranged to overlap some of the signal lines 150Ab, 150Ac, 150Ad, 150Ae, 150Af, 150Ag and 150Ah disposed on the different layer as depicted in the embodiment of FIG. 1D. In one embodiment shown in FIG. 1D, signal lines 150Ab, 150Ac and 150Ad are formed on the gate insulation layer 183A spaced part from one another while the detection signal line 150Aa is formed on the inter-layer insulation layer 185A. Here, the detection signal line 150Aa overlaps with the signal lines 150Ab, 150Ac and 150Ad.

In FIG. 1D, the detection signal line 150Aa overlaps all of signal lines 150Ab, 150Ac and 150Ad. However, the signal lines 150Ab, 150Ac and 150Ad may be partially overlapped by the detection signal line 150Aa. Further, in FIG. 1D, the signal lines 150Ab, 150Ac and 150Ad are formed on a same layer and spaced apart from one another. However, they may be formed on two or more different layers such that they do not overlap one another.

Signals applied to the detection signal line 150Aa may have a higher voltage level than signals applied to the plurality of signal lines 150Ab, 150Ac, 150Ad, 150Ae, 150Af, 150Ag and 150Ah. Therefore, the width W2 of the detection signal line 150Aa may be larger than each width of the signal lines 150Ab, 150Ac, 150Ad, 150Ae, 150Af, 150Ag and 150Ah so that the detection signal line 150Aa has lower resistance. For example, the width W2 of the detection signal line 150Aa may be 1,000 μm or less.

The detection signal line 150Aa may be a line provided for the processor to check whether charging is being carried out (e.g., USB_VBUS line). Since a constant level of voltage is applied to the detection signal line 150Aa, it can be arranged to overlap the signal lines 150Ab, 150Ac, 150Ad, 150Ae, 150Af, 150Ag and 150Ah without significant increase in noise between the lines. In this arrangement, the area occupied by the plurality of connecting lines 150A on the non-display area NDA of the transparent substrate 110A can be reduced as compared to the configuration where the detection signal line 150Aa does not overlap of the signal lines 150Ab, 150Ac, 150Ad, 150Ae, 150Af, 150Ag and 150Ah. Accordingly, the width of the bezel of the transparent OLED device 100A can be further reduced.

Some of the plurality of connecting lines 150A are made of the same material as the material for the gate electrode 184A of the thin-film transistor formed on the display area DA of the transparent substrate 110A. The others plurality of connecting lines 150A are made of the same material as the material for the source electrode 186A and the drain electrode 187A of the thin-film transistor. As illustrated in FIG. 1C, the SPK_P line 150Af and the MIC_P 150Ah are made of the same material as the material for the gate electrode 184A of the thin-film transistor. The SPK_N line 150Ae and the MIC_N line 150Ag are made of the same material as the material for the source electrode 186A and the drain electrode 187A. In addition, as illustrated in FIG. 1D, the USB_ID line 150Ab, the USB DP line 150Ac and USB DN line 150Ad are made of the same material as the material for the gate electrode 184A of the thin-film transistor. The detection signal line 150Aa, which is a USB_VBUS line for example, is made of the same material as the material for the source electrode 186A and the drain electrode 187A. As used herein, the expression that two elements are made of the same material means that one element includes a layer made of the same material as the material for the other element, and that one element is produced together with the other elements. Forming two elements with the same material can simplify the process and design.

The configuration of the pad unit 180A illustrated in FIG. 1B and the configuration of the plurality of connecting lines 150A illustrated in FIGS. 1C and 1D are merely illustrative. The configuration of the pad unit 180A illustrated in FIG. 1B and the configuration of the plurality of connecting lines 150A can be modified depending on the elements formed on the both sides of the transparent substrate 110A. For example, when a camera module is disposed on a side of the transparent substrate 110A, the plurality of connecting lines 150A connects the processor to the camera module and may include lines to transmit/receive image or video signals. Further, the lines to transmit/receive image or video signals may be connected to the pad unit 180A. Although the embodiments in the present disclosure are described in reference to the USB standard, it should be appreciated that the transparent OLED device 100A may employ various other types of interface standards. Accordingly, the configuration of the pad unit 180A and the connecting lines 150A connected thereto may be changed according to the interface standards used in the transparent OLED device 100A.

In FIG. 1D, the detection signal line 150Aa overlaps the signal lines 150Ab, 150Ac and 150Ad. However, the detection signal line 150Aa and the signal lines 150Ab, 150Ac and 150Ad may be formed on a same layer spaced apart from one another, or may be formed on two or more different layers so that the former dose not overlap the latter, depending on the level or type of voltage applied to the detection signal line 150Aa and on the available area of the non-display area NDA of the transparent substrate 110A.

In FIGS. 1C and 1D, some of the plurality of connecting lines 150A are made of the same material as the material for the gate electrode 184A of the thin-film transistor. The others plurality of connecting lines 150A are made of the same material as the material for the source electrode 186A and the drain electrode 187A. However, some of the plurality of connecting lines 150A may be made of the same material as the material for the reflective layer 191A or the cathode 195A. In this instance, the plurality of connecting lines 150A may be formed on three or more different layers to overlap one another, depending on design choices. By doing so, the width of the bezel of the transparent OLED device 100A can be further reduced.

Figure 2A:
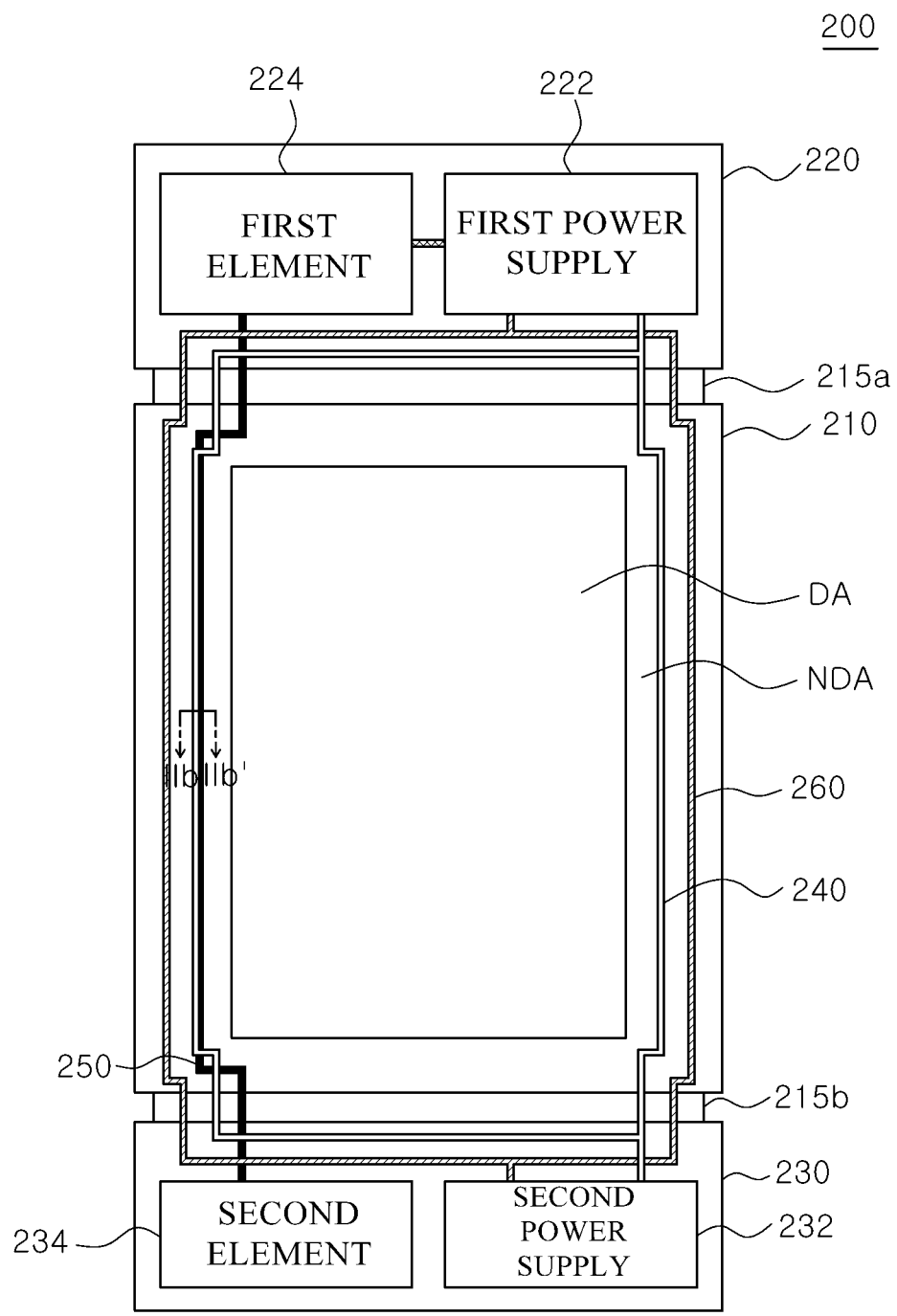
FIG. 2A is a simplified plan view for illustrating lines of a transparent display device according to an exemplary embodiment of the present disclosure.
Figure 2B:
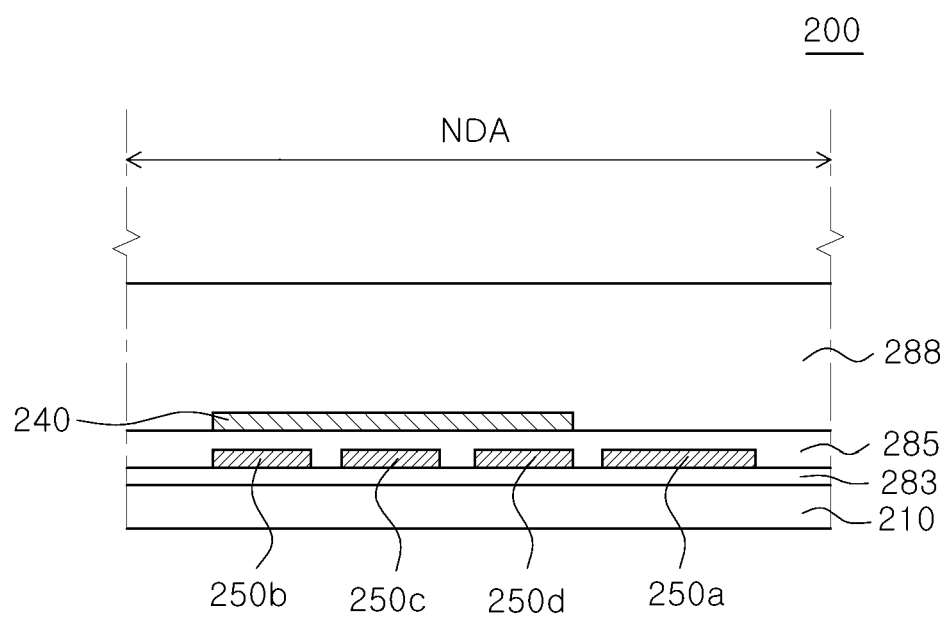
FIG. 2B is a cross-sectional view of the transparent display device, taken along line IIb-IIb' of FIG. 2A.

FIG. 2A is a simplified plane view of a transparent display device according to an exemplary embodiment of the present disclosure. FIG. 2B is a cross-sectional view of the transparent display device, taken along line IIb-IIb' of FIG. 2A. A transparent display device 200 may include various types of transparent display devices. For example, the transparent display device 200 may include a transparent OLED device or a transparent liquid crystal display device.

Referring to FIG. 2A, the transparent display device 200 includes a transparent substrate 210, a first substrate 220, a second substrate 230, and a third substrate 215a and 215b. The transparent substrate 210 includes a display area DA and a non-display area NDA disposed on the periphery of the display area DA. The first substrate 220 is connected to a side of the transparent substrate 210 while the second substrate 230 is connected to another side of the transparent substrate 210. On the first substrate 220, a first power supply 222 and a first element 224 are disposed. On the second substrate 230, a second power supply 232 and a second element 234 are disposed. A third substrate 215a connects the transparent substrate 210 to the first substrate 220. A third substrate 215b connects the transparent substrate 210 to the second substrate 230.

On the transparent substrate 210, an auxiliary power line 240, a plurality of connecting lines 250 and a ground (GND) line 260 are formed. FIG. 2A illustrates the connective relationships among the elements. In FIG. 2A, the auxiliary power line 240, the plurality of connecting lines 250 and the ground line 260 are drawn as if they were formed across the transparent substrate 210, the first substrate 220, the second substrate 230, and the third substrates 215a and 215b. However, FIG. 2A merely illustrates electrically connected relationships among them. That is to say, the auxiliary power line 240, the plurality of connecting lines 250 and the ground line 260 are actually formed only on the transparent substrate 210 and are electrically connected to elements disposed on the first substrate 220 or the second substrate 230 via other lines formed on the third substrates 215a and 215b.

The plurality of connecting lines 250 formed on the non-display area NDA of the transparent substrate 210 electrically connect the elements formed on the first substrate 220 and the elements formed on the second substrate 230. Referring to FIGS. 2A and 2B, the plurality of connecting lines 250 electrically connect the first element 224 formed on the first substrate 220 and the second element 234 formed on the second substrate 230. The first element 224 and the second element 234 maybe one of a processor, a USB unit, a microphone, a speaker, a camera module, various types of sensors and the like.

The plurality of connecting lines 250 may be formed on a same layer spaced apart from one another. Although the plurality of connecting lines 250 includes four lines 250a, 250b, 250c and 250d in FIG. 2B, the number and width of the lines may be changed depending on the types of the first element 224 and the second element 234. Further, the plurality of connecting lines 250 maybe formed on two or more different layers depending on the design of the display area DA and the non-display area NDA of the transparent display device 200. When the plurality of the connecting lines 250 are formed on two or more different layers, they do not overlap one another or they partially overlap one another. That is to say, when the plurality of connecting lines 250 are separately formed on two or more different layers, some of the connecting lines 250 formed on a layer may overlap the other connecting lines 250 formed on another layer, or some of the connecting lines 250 may not overlap one another.

Referring to FIG. 2A, in the non-display area NDA of the transparent substrate 210, the auxiliary power line 240 and the ground line 260 are formed. The auxiliary power line 240 is configured to supply power to the first power supply 222 disposed on the first substrate 220. That is to say, power from an external power source is supplied to the second power supply 232 disposed on the second substrate 230, and is supplied to the first power supply 222 disposed on the first substrate 220 from the second power supply 232 via the auxiliary power line 240.

The external power source supplying power to the second power supply may be a battery.

The first power supply 222 and the second power supply 232 receive power in the form of voltage at a specific level from the external power source and transform the received power into a voltage of a level as required by each of the elements to supply it. An example is described with reference to FIG. 2A. If the first element 224 is a processor, the second power supply 232 receives power from the external power source to output a voltage as required by the first power supply 222. The first power source 222 receives power via the auxiliary power line 240 to output a voltage as required by the processor.

The first power supply 222 and the second power supply 232 are connected to each other via the ground line 260. The ground line 260 may be one of the lines to drive the elements of the display area DA. For example, the elements of the display area DA may be organic light-emitting elements or liquid crystal elements.

The auxiliary power line 240 and the plurality of the connecting lines 250 are not associated with driving the elements of the display area DA of the transparent display device 200 and are additionally formed on the non-display area NDA of the transparent substrate 210. The transparent display device 200 does not employ an additional interconnection film to electrically connect elements formed on two sides of the transparent display device 200. Therefore, it is necessary to additionally form the auxiliary power line 240 and the plurality of the connecting lines 250 on the transparent substrate 210. Unlike the embodiment described in reference to FIG. 1A, the auxiliary power line 240 in FIG. 2A is dedicated for connecting the elements formed on two sides of the transparent display device 200, independently of existing lines in the display area DA. In other words, the auxiliary power line 240 is not used in providing power to the elements of the display area DA. Accordingly, it is not necessary to take into account the level of a voltage or the amplitude of a current supplied to the elements formed on the display area DA, thereby allowing for various design choices.

When the transparent display device 200 is an OLED device, elements formed on two sides of the transparent substrate 210 can be more stably connected by introducing the auxiliary power line 240. If the power for driving the elements of the display area DA of the transparent OLED device is different from the power to be supplied to the first power supply 222, the auxiliary power line 240 formed on the non-display area NDA is added in addition to the power lines to drive the elements of the display area DA, so that the first power supply 222 can receive power more stably. In addition, the ground line 250 can be utilized as a VSS line for the transparent OLED device.

When the transparent display device 200 is a liquid crystal display device, a liquid crystal element is formed on the display area DA of the transparent substrate 210. The elements formed on two sides of the transparent substrate 210 can be electrically connected via the auxiliary power line 240 and the plurality of the connecting lines 250 formed on the non-display area of the transparent substrate 210. In addition, the ground line 260 can be utilized as a common electrode line for the transparent liquid crystal display device.

As the auxiliary power line 240 and the plurality of connecting lines 250 are formed on the non-display area NDA of the transparent substrate 210, the width of the bezel of the transparent display device 200 may be increased by the sum of the width of the auxiliary power line 240 and the width of the plurality of connecting lines 250. However, the width of the bezel of the transparent display device 200 according to the exemplary embodiment of the present disclosure can be reduced eventually, because the sum of the width of the auxiliary power line 240 and the width of the connecting lines 250 is less than the width of an additional interconnection film to connect elements formed on two sides of the transparent display device 200.

A part of the auxiliary power line 240 and some of the connecting lines 250 may be formed on two or more different layers, and a part of the auxiliary power line 240 maybe arranged to overlap with some of the connecting lines 250. Referring to FIG. 2B, the auxiliary power line 240 formed on the second insulation layer 285 overlaps some of the connecting lines 250 formed on the first insulation layer 283. In FIG. 2B, the auxiliary power line 240 overlaps some of the connecting lines 250b, 250c and 250d.

Similar to the detection signal line 150Aa described above, a constant level of voltage may be applied to the auxiliary power line 240. Accordingly, increase in the noise level between the lines may not be significant even when the auxiliary power line 240 is arranged to overlap with some of the connecting lines 250. In this configuration, the area occupied by the auxiliary power line 240 and by the plurality of connecting lines 250 on the non-display area NDA of the transparent substrate 210 can be reduced to narrow the bezel of the transparent display device 200 as compared to arranging the auxiliary power line 240 not to overlap with other connecting lines 250.

In FIG. 2A, the first power supply 222 is disposed on the first substrate 220 while the second power supply 232 is disposed on the second substrate 230. However, the first power supply 222 and the second power supply 232 both may be disposed on a single substrate. For example, when both of the first power supply 222 and the second power supply 232 are disposed on the second substrate 230, only the connecting lines 250 to electrically connect the first element 224 disposed on the first substrate 220 to the second element 234 disposed on the second substrate 230 may be formed on the non-display area NDA of the transparent substrate 210, without an additional power line to connect the first power supply to the second power supply 232. In this example, the second element 234 may be a processor while the first element 224 may be one of a camera module, a speaker, a microphone and various types of sensors. If the second element 234 disposed on the second substrate 230 is a processor, the processor may receive power from the first power supply 222 or the second power supply 232 and may be connected to the first element disposed on the first substrate 220 via the connecting lines 250. As will be appreciated, the structure illustrated in FIG. 2A is merely an example and can be modified depending on the size of the transparent display device and applications.

Hereinafter, various characteristics of the transparent OLED device according to the present disclosure will be described.

According to another characteristic of the present disclosure, the device further includes one or more elements disposed on the first circuit board, one or more elements disposed on the second circuit board, and a plurality of connecting lines on the non-display area of the transparent substrate electrically connecting at least one of the elements on the first circuit board and at least one of the elements on the second circuit board.

According to still another characteristic of the present disclosure, said at least one of the elements on the first circuit board connected to said at least one of the elements on the second circuit board via the plurality of the connecting lines is configured to receive power from the first power supply.

According to still another characteristic of the present disclosure, said at least one of the elements that receives power from the first power supply is a processor configured to send a signal to and/or receive the signal from said at least one of the elements on the second circuit board via the plurality of connecting lines.

According to still another characteristic of the present disclosure, the device further includes a second power line formed on the non-display area of the transparent substrate in the non-display area thereof, wherein the plurality of connecting lines is disposed between the second power line and the display area.

According to still another characteristic of the present disclosure, the plurality of connecting lines includes a plurality of signal lines.

According to still another characteristic of the present disclosure, the plurality of the signal lines are disposed on a same layer and spaced apart from one another.

According to still another characteristic of the present disclosure, at least one of the signal lines is disposed on a different layer from another signal line without being overlapped by one another.

According to still another characteristic of the present disclosure, a width of each of the signal lines is equal to or less than 100 μm.

According to still another characteristic of the present disclosure, the plurality of the connecting lines further include at least one detection signal line, wherein the detection signal line is disposed on a different layer from a layer where said one or more signal lines are disposed on.

According to still another characteristic of the present disclosure, the detection signal line and said one or more signal lines are arranged such that at least some part of the detection signal line overlaps with some of the signal lines.

According to still another characteristic of the present disclosure, a width of the detection signal line is equal to or less than 1000 μm.

According to still another characteristic of the present disclosure, the device further includes a thin-film transistor formed on the display area of the transparent substrate in the display area thereof, the thin-film transistor having an active layer, a gate electrode, a source electrode, and a drain electrode, wherein at least one of the connecting lines is made of the same material as the gate electrode, and wherein at least one of the connecting lines is made of the same material as the source electrode or the drain electrode.

Hereinafter, various characteristics of the transparent device according to the present disclosure will be described.

According to another characteristic of the present disclosure, the plurality of the connecting lines are disposed on a same layer and spaced apart from one another.

According to still another characteristic of the present disclosure, the plurality of the connecting lines is disposed on two or more different layers without being overlapped with one another.

According to still another characteristic of the present disclosure, the plurality of the connecting lines are disposed on two or more different layers, and wherein at least one of the connecting lines on one layer at least partially overlaps with another connecting line on another layer.

According to still another characteristic of the present disclosure, the device further includes a first power supply disposed on the first substrate; and an auxiliary power line formed on the non-display area of the transparent substrate in the non-display area thereof providing power to the first power supply.

According to still another characteristic of the present disclosure, the device further includes a second power supply disposed on the second substrate, wherein the second power supply is configured to supply power to the first power supply via the auxiliary power line.

According to still another characteristic of the present disclosure, apart of the auxiliary power line overlaps with at least some of the plurality of connecting lines The present invention has been described in more detail with reference to the exemplary embodiments, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A transparent display device, comprising:
   a transparent substrate having a display area and a non-display area adjacent to the display area;
   an organic light-emitting element on the display area of the transparent substrate;
   a first power line on the display area of the transparent substrate, the first power line supplying power to the organic light-emitting element;
   a first circuit board having a first power supply provided on a first side of the transparent substrate; and
   a second circuit board having a second power supply provided on a second side of the transparent substrate,
   wherein the first power supply is configured to receive power from the second power supply via the first power line.

2. The device of claim 1, further comprising:
   one or more elements disposed on the first circuit board;
   one or more elements disposed on the second circuit board; and
   a plurality of connecting lines on the non-display area of the transparent substrate electrically connecting at least one of the elements on the first circuit board and at least one of the elements on the second circuit board.

3. The device of claim 2, wherein said at least one of the elements on the first circuit board connected to said at least one of the elements on the second circuit board via the plurality of the connecting lines is configured to receive power from the first power supply.

4. The device of claim 3, wherein said at least one of the elements that receives power from the first power supply is a processor configured to perform at least one of sending a signal or receiving the signal from said at least one of the elements on the second circuit board via the plurality of connecting lines.

5. The device of claim 2, further comprising:
a second power line formed on the non-display area of the transparent substrate,
wherein the plurality of connecting lines is disposed between the second power line and the display area.

6. The device of claim 2, wherein the plurality of connecting lines includes a plurality of signal lines.

7. The device of claim 6, the plurality of the signal lines are disposed on a same layer and spaced apart from one another.

8. The device of claim 6, wherein at least one of the signal lines is disposed on a different layer from another signal line without being overlapped by one another.

9. The device of claim 6, wherein a width of each of the signal lines is equal to or less than 100 μm.

10. The device of claim 6, wherein the plurality of the connecting lines further include at least one detection signal line, wherein the detection signal line is disposed on a different layer from a layer where said one or more signal lines are disposed on.

11. The device of claim 10, wherein the detection signal line and said one or more signal lines are arranged such that at least some part of the detection signal line overlaps with some of the signal lines.

12. The device of claim 11, wherein a width of the detection signal line is equal to or less than 1000 μm.

13. The device of claim 2, further comprising:
a thin-film transistor formed on the display area of the transparent substrate, the thin-film transistor having an active layer, a gate electrode, a source electrode, and a drain electrode,
wherein at least one of the connecting lines is made of the same material as the gate electrode, and wherein at least one of the connecting lines is made of the same material as the source electrode or the drain electrode.

14. A transparent display device, comprising:
a transparent substrate having a display area and a non-display area adjacent to the display area;
a first substrate and a second substrate, each connected to a different side of the transparent substrate; and
a plurality of connecting lines on the non-display of the transparent substrate, the plurality of connecting lines electrically connecting a first element on the first substrate and a second element on the second substrate.

15. The device of claim 14, wherein the plurality of the connecting lines are disposed on a same layer and spaced apart from one another.

16. The device of claim 14, wherein the plurality of the connecting lines are disposed on two or more different layers without being overlapped with one another.

17. The device of claim 14, wherein the plurality of the connecting lines are disposed on two or more different layers, and wherein at least one of the connecting lines on one layer at least partially overlaps with another connecting line on another layer.

18. The device of claim 14, further comprising:
a first power supply disposed on the first substrate; and
an auxiliary power line formed on the non-display area of the transparent substrate providing power to the first power supply.

19. The device of claim 18, further comprising:
a second power supply disposed on the second substrate,
wherein the second power supply is configured to supply power to the first power supply via the auxiliary power line.

20. The device of claim 18, wherein a part of the auxiliary power line overlaps with at least some of the plurality of connecting lines.

* * * * *